United States Patent
Kawachi et al.

(10) Patent No.: US 10,187,035 B2
(45) Date of Patent: Jan. 22, 2019

(54) ACOUSTIC WAVE DEVICE

(71) Applicant: TAIYO YUDEN CO., LTD., Tokyo (JP)

(72) Inventors: Osamu Kawachi, Tokyo (JP); Rei Oikawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/447,691

(22) Filed: Mar. 2, 2017

(65) Prior Publication Data

US 2017/0272049 A1  Sep. 21, 2017

(30) Foreign Application Priority Data

Mar. 18, 2016 (JP) ................ 2016-055379

(51) Int. Cl.
*H03H 9/02* (2006.01)
*H03H 9/64* (2006.01)
*H03H 9/72* (2006.01)

(52) U.S. Cl.
CPC .... *H03H 9/02574* (2013.01); *H03H 9/02007* (2013.01); *H03H 9/02535* (2013.01); *H03H 9/02866* (2013.01); *H03H 9/64* (2013.01); *H03H 9/725* (2013.01)

(58) Field of Classification Search
CPC ........... H03H 9/02007; H03H 9/02535; H03H 9/02574; H03H 9/02866; H03H 9/64; H03H 9/725
USPC .......................................... 333/133, 193–196
See application file for complete search history.

(56) References Cited

U.S. PATENT DOCUMENTS

| | | | |
|---|---|---|---|
| 5,576,589 | A | 11/1996 | Dreifus et al. |
| 2003/0214369 | A1* | 11/2003 | Kearns ............... H03H 9/0038 333/133 |
| 2005/0077982 | A1 | 4/2005 | Funasaka |
| 2010/0088868 | A1 | 4/2010 | Kando et al. |

FOREIGN PATENT DOCUMENTS

| | | |
|---|---|---|
| JP | 6-172078 A | 6/1994 |
| JP | H10-507599 A | 7/1998 |
| JP | 2002-305426 A | 10/2002 |
| JP | 2005-309161 A | 11/2005 |
| JP | 2007-261910 A | 10/2007 |
| JP | 2011-135245 A | 7/2011 |
| JP | 2013-66032 A | 4/2013 |
| JP | 2013-201468 A | 10/2013 |
| JP | 2014-160888 A | 9/2014 |

(Continued)

OTHER PUBLICATIONS

"Wikipeida Silicon", https://en.wikipedia.org/wiki/Silicon accessed on Apr. 9, 2018.*

(Continued)

*Primary Examiner* — Robert J Pascal
*Assistant Examiner* — Jorge Salazar, Jr.
(74) *Attorney, Agent, or Firm* — Chen Yoshimura LLP

(57) ABSTRACT

An acoustic wave device includes: a piezoelectric substrate that is made of a single crystal piezoelectric material, and includes a first region including an upper surface, and a second region that is located under the first region and has a density less than a density of the first region; and an IDT located on the upper surface of the piezoelectric substrate.

13 Claims, 8 Drawing Sheets

(56) References Cited

FOREIGN PATENT DOCUMENTS

| JP | 2017-098719 A | 6/2017 |
|---|---|---|
| KR | 10-2005-0021876 A | 3/2005 |
| WO | 96/12344 A1 | 4/1996 |
| WO | 2009/081651 A1 | 7/2009 |
| WO | 2013/031651 A1 | 3/2013 |

OTHER PUBLICATIONS

"Wikipeida Diamond", https://en.wikipedia.org/wiki/diamond accessed on Apr. 9, 2018.*
"Wikipeida Lithium Tantalate", https://en.wikipedia.org/wiki/lithium_tantalate accessed on Apr. 9, 2018.*
Japanese Office Action dated Dec. 12, 2017, in a counterpart Japanese patent application No. 2016-055379. (A machine translation (not reviewed for accuracy) attached.).
Korean Office Action dated Jan. 29, 2018, in a counterpart Korean patent application No. 10-2017-0030419.
Japanese Office Action dated May 15, 2018, in a counterpart Japanese patent application No. 2016-055379. (A machine translation (not reviewed for accuracy) attached.).

* cited by examiner

ACOUSTIC WAVE DEVICE

CROSS-REFERENCE TO RELATED APPLICATION

This application is based upon and claims the benefit of priority of the prior Japanese Patent Application No. 2016-055379, filed on Mar. 18, 2016, the entire contents of which are incorporated herein by reference.

FIELD

A certain aspect of the present invention relates to an acoustic wave device.

BACKGROUND

In acoustic wave devices, an Interdigital Transducer (IDT) exciting an acoustic wave is formed on a piezoelectric substrate. The piezoelectric substrate is, for example, a lithium tantalate ($LiTaO_3$) substrate or a lithium niobate ($LiNbO_3$) substrate. When the Li compositions in lithium tantalate and lithium niobate are stoichiometric, they are called a stoichiometry composition. When the Li composition is a little less than the stoichiometric composition, it is called a congruent composition. Most of the lithium tantalate substrates and the lithium niobate substrates have a congruent composition.

Japanese Patent Application Publication No. 2013-66032 (Patent Document 1) describes that lithium is diffused to the surface of a substrate with a congruent composition to form a region with a stoichiometry composition on the substrate surface. Japanese Patent Application Publication Nos. 2011-135245 and 2002-305426 (Patent Documents 2 and 3) describe that a piezoelectric substance with a stoichiometry composition is used for an acoustic wave device. International Publication No. 2013/031651 (Patent Document 4) describes that a dielectric film is provided under a piezoelectric film.

To reduce the loss of the acoustic wave device, it is required to reduce the leak of the acoustic wave excited by the IDT. However, there is no known preferable structure in the piezoelectric substrate for reducing the loss of the acoustic wave device.

SUMMARY OF THE INVENTION

According to an aspect of the present invention, there is provided an acoustic wave device including: a piezoelectric substrate that is made of a single crystal piezoelectric material, and includes a first region including an upper surface, and a second region that is located under the first region and has a density less than a density of the first region; and an IDT located on the upper surface of the piezoelectric substrate.

DETAILED DESCRIPTION

A description will be given of embodiments of the present invention with reference to the accompanying drawings.

First Embodiment

Figure 1A:
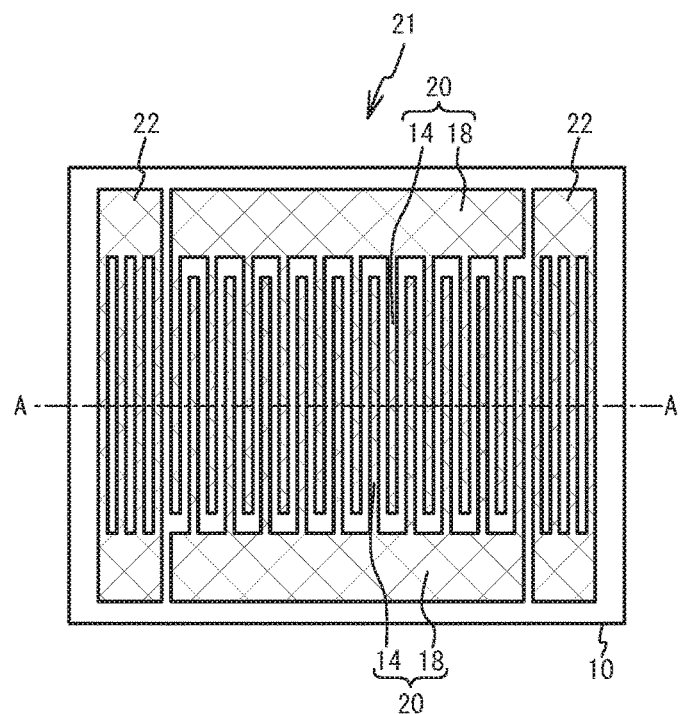
FIG. 1A is a plan view of an acoustic wave resonator in accordance with a first embodiment.
Figure 1B:
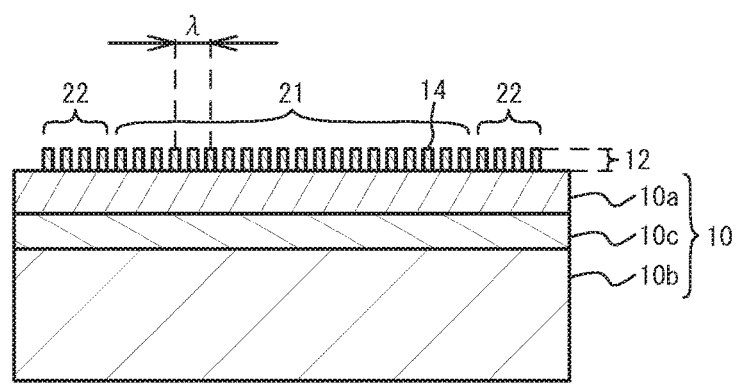
FIG. 1B is a cross-sectional view taken along line A-A in FIG. 1A.

An acoustic wave resonator will be described as an acoustic wave device. FIG. 1A is a plan view of an acoustic wave resonator in accordance with a first embodiment, and FIG. 1B is a cross-sectional view taken along line A-A in FIG. 1A. As illustrated in FIG. 1A and FIG. 1B, an IDT 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes a plurality of electrode fingers 14 and a bus bar 18 to which the electrode fingers 14 are connected. The pair of comb-shaped electrodes 20 are arranged so as to face each other so that the electrode fingers 14 of one of the comb-shaped electrodes 20 and the electrode fingers 14 of the other are arranged substantially in an alternate order. The acoustic wave excited by the IDT 21 mainly propagates in the alignment direction of the electrode fingers 14. The pitch of the electrode fingers 14 is approximately equal to the wavelength λ of the acoustic wave. The piezoelectric substrate 10 is a lithium tantalate substrate or a lithium niobate substrate. The metal film 12 is, for example, an aluminum film, a copper film, a titanium film, or a chrome film, or a composite film of at least two of them. The metal film 12 has a film thickness of, for example, 100 to 400 nm.

As illustrated in FIG. 1B, the piezoelectric substrate 10 includes a first region 10a, a second region 10b, and a third region 10c. The first region 10a includes the upper surface of the piezoelectric substrate 10. The IDT 21 and the reflectors 22 are located on the upper surface of the piezoelectric substrate 10. The second region 10b is located under the first region 10a. The third region 10c is located between the first region 10a and the second region 10b. The first region 10a is a region having a congruent composition. The second region 10b has a stoichiometry composition. The third region 10c is a transition region from the congruent composition to the stoichiometry composition. In the stoichiometry composition, a composition ratio of lithium to lithium and tantalum (or niobium) (hereinafter, described as a lithium composition ratio) is 49.5% or greater and 50.5% or less. In the congruent composition, the lithium composition ratio is 49.5% or less. The lithium composition ratio is, for example, 48% or greater. In each of the first region 10a and the second region 10b, the lithium composition ratio is substantially constant. In the third region 10c, the lithium composition ratio gradually changes. The third region 10c may not necessarily be located.

For example, in an acoustic wave device using a leaky wave, the acoustic wave excited by the IDT 21 is mainly a leaky wave. The IDT 21 emits a bulk wave in addition to the surface acoustic wave. Since the bulk wave does not contribute to resonance, as the energy of the bulk wave increases, the loss of the resonator increases.

Figure 2:
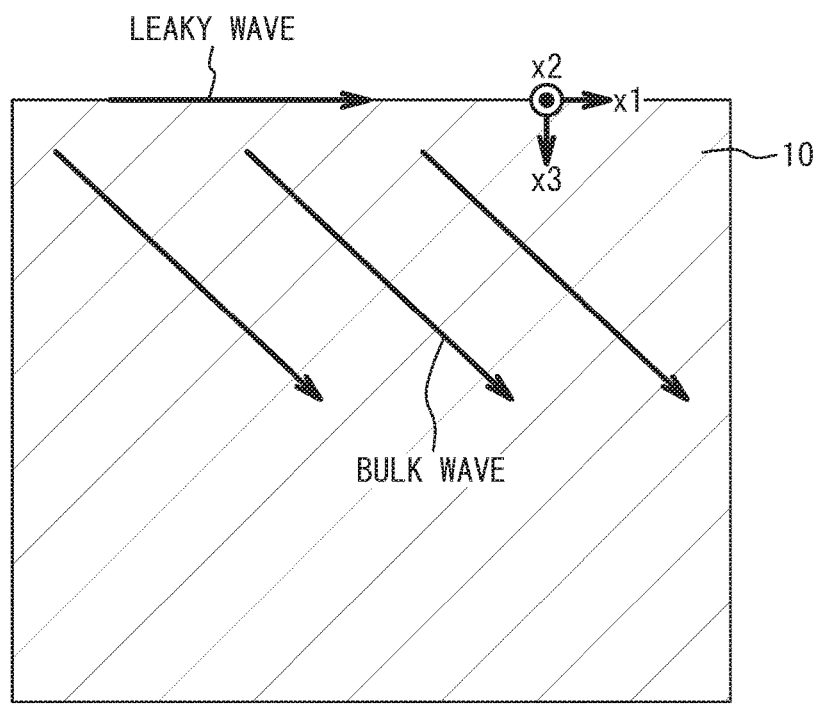
FIG. 2 is a cross-sectional view of a piezoelectric substrate illustrating an image of a leaky waves and a bulk wave in the piezoelectric substrate.

FIG. 2 is a cross-sectional view of the piezoelectric substrate illustrating an image of a leaky wave and a bulk wave in the piezoelectric substrate. In FIG. 2, the x1 direction is the propagation direction of a leaky wave on the surface of the piezoelectric substrate 10, the x2 direction is a direction perpendicular to the x1 direction on the surface of the piezoelectric substrate 10, and the x3 direction is the depth direction of the piezoelectric substrate 10. The main displacement component of a leaky wave is an SH wave. Thus, the leaky wave is displaced mainly in the x2 direction. On the other hand, the leaky wave propagates while emitting a bulk wave into the piezoelectric substrate 10. The emission of the bulk wave causes the loss of the acoustic wave device.

Figure 3:
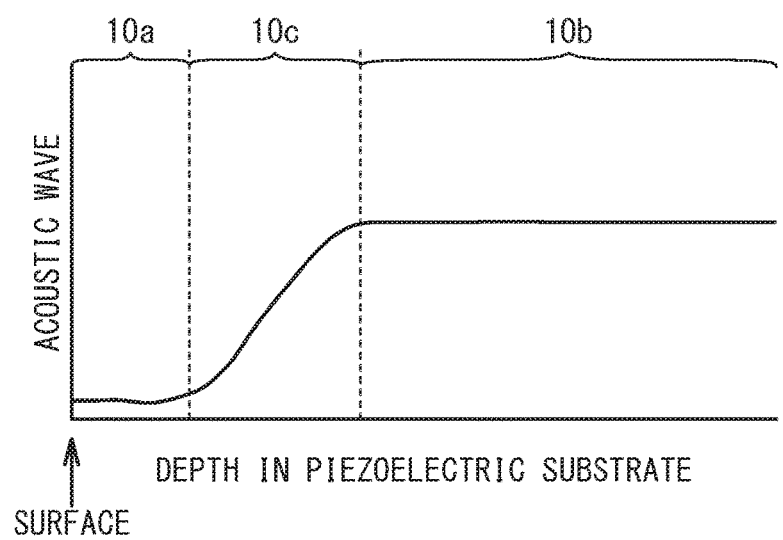
FIG. 3 is a graph of acoustic velocity versus depth in the piezoelectric substrate in the first embodiment.

FIG. 3 is a graph of acoustic velocity versus depth in the piezoelectric substrate in the first embodiment. In the following description, the acoustic velocity of the bulk wave will be focused on, but the relationship between the acoustic velocity of the bulk wave and the lithium composition ratio is substantially the same as the relationship between the acoustic velocity of the surface acoustic wave and the lithium composition ratio. Therefore, a description will be simply given of the acoustic velocity. The acoustic velocity in the stoichiometry composition is greater than the acoustic velocity in the congruent composition. Thus, as illustrated in FIG. 3, the acoustic velocity in the first region 10a is less than the acoustic velocity in the second region 10b. In the third region 10c, the acoustic velocity gradually changes. The energy of the acoustic wave concentrates in the region in which the acoustic velocity is low. For example, when a leaky wave is used, the boundary between the first region 10a and the second region 10b is structured to be located substantially between the leaky wave and the bulk wave in FIG. 2. This structure inhibits the emission of a bulk wave because the velocity of the bulk wave is fast in a deep region. Accordingly, the energy concentrates in the first region 10a. Therefore, the insertion loss of the acoustic wave resonator can be improved.

The measured acoustic velocity of a Rayleigh wave in a 42° rotated Y-cut X-propagation lithium tantalate substrate by a linear focused beam acoustic microscope is approximately 3125 m/second in the congruent composition, and is approximately 3170 m/second in the stoichiometry composition. The acoustic velocity of the surface acoustic wave is proportional to the square root of (elastic modulus/density). The elastic modulus relates to a Young's modulus and a Poisson ratio. Between the stoichiometry composition and the congruent composition, the Young's moduluses and the Poisson ratios are approximately the same. In contrast, the density of the congruent composition is greater than the density of the stoichiometry composition. For example, in a lithium tantalate substrate, the density of the congruent composition is 7454 kg/m$^3$, while the density of the stoichiometry composition is 7420 to 7440 kg/m$^3$. Thus, the acoustic velocity in the stoichiometry composition is greater than the acoustic velocity in the congruent composition.

In Patent Document 4, located under a lithium niobate substrate is a dielectric film such as a silicon oxide film or a silicon nitride film. The silicon oxide film or the silicon nitride film has an acoustic velocity greater than that of lithium niobate. However, in this structure, a bulk wave is reflected by a boundary face between the lithium niobate substrate and the dielectric film. As a result, spurious due to the bulk wave occurs. On the other hand, the first embodiment provides the first region 10a in which the acoustic velocity is high and the second region 10b in which the acoustic velocity is low by making the densities different in a single crystal piezoelectric material. This structure can confine the acoustic wave in the second region 10b without making the bulk wave reflected.

In the first embodiment, the piezoelectric substrate 10 is made of a single crystal piezoelectric material, and includes the first region 10a including the upper surface, and the second region 10b located under the first region 10a and having a density less than that of the first region 10a. The IDT 21 is located on the upper surface of the piezoelectric substrate 10. This structure makes the energy of the bulk wave concentrate in the first region 10a, improving the insertion loss of the acoustic wave device. The densities of the first and second regions 10a and 10b can be estimated from the lithium composition ratio by X-ray diffractometry.

In addition, the velocity of the acoustic wave in the second region 10b is greater than the velocity of the acoustic wave in the first region 10a. This structure allows the energy of the bulk wave to concentrate in the first region 10a.

Furthermore, when the piezoelectric substrate 10 is a lithium tantalate substrate or a lithium niobate substrate, the first region 10a has a congruent composition, and the second region 10b has a stoichiometry composition. This structure can make the velocity of the acoustic wave in the second region 10b greater than that in the first region 10a.

Located between the first region 10a and the second region 10b is the third region 10c of which the density changes from the first region 10a to the second region 10b. This structure can inhibit the reflection of the bulk wave due to the rapid change in density.

The thickness of the first region 10a is preferably equal to or greater than the pitch λ of the electrode fingers 14 in the IDT 21. The surface acoustic wave energy concentrates in a region from the upper surface of the piezoelectric substrate 10 to the depth of approximately λ. Thus, when the thickness of the first region 10a is less than λ, the surface acoustic wave attenuates. Therefore, the thickness of the first region 10a is preferably equal to or greater than the pitch λ of the electrode fingers 14 in the IDT 21. The thickness of the first region 10a is preferably 2λ or greater, more preferably 5λ or greater. To concentrate the energy of the bulk wave in the first region 10a, the thickness of the first region 10a is preferably 20λ or less, more preferably 10λ or less.

To concentrate the energy of the bulk wave in the first region 10a, the thickness of the second region 10b is preferably 10λ or greater, more preferably 20λ or greater. To inhibit the reflection of the bulk wave, the thickness of the third region 10c is preferably 1λ or greater, more preferably 2λ or greater. To concentrate the energy of the bulk wave in the first region 10a, the thickness of the third region 10c is preferably 5λ or less, more preferably 10λ or less.

An exemplary case where the lithium composition (i.e., the density) is approximately constant in each of the first region 10a and the second region 10b has been described, but the lithium composition (the density) may be inclined in the thickness direction in each of the first region 10a and the second region 10b. For example, it is only required that the average density of the first region 10a is greater than the average density of the second region 10b.

Figure 4A:
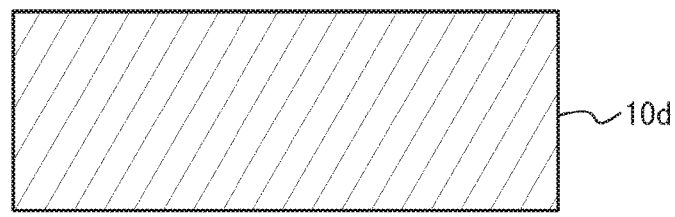
FIG. 4A through FIG. 4D are cross-sectional views illustrating a method of fabricating the acoustic wave resonator of the first embodiment.

A description will next be given of a fabrication method of the first embodiment. FIG. 4A through FIG. 4D are cross-sectional views illustrating a method of fabricating the acoustic wave resonator in accordance with the first embodiment. As illustrated in FIG. 4A, a piezoelectric substrate 10d with a congruent composition is prepared. A lithium tantalate substrate or a lithium niobate substrate is prepared as the piezoelectric substrate 10d.

Figure 4B:
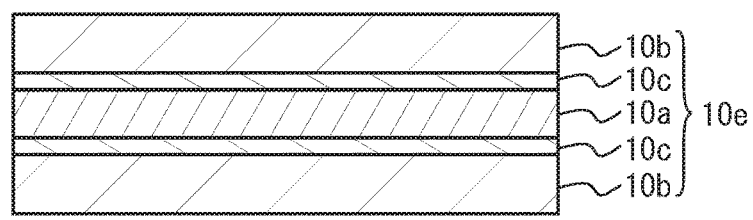

As illustrated in FIG. 4B, the second region 10b with a stoichiometry composition is formed by diffusing lithium to the upper and lower surfaces of the piezoelectric substrate 10d. As a method of diffusing lithium, employed is, for example, the method disclosed in Patent Document 1. A region between the second regions 10b becomes the first region 10a with a congruent composition. Between the first region 10a and the second region 10b, formed is the third region 10c of which the lithium composition gradually changes. The above processes form a piezoelectric substrate 10e. The first region 10a may be formed only on the lower surface of the upper and lower surfaces by diffusing lithium only to the lower surface of the lower and upper surfaces of the piezoelectric substrate 10d.

Figure 4C:
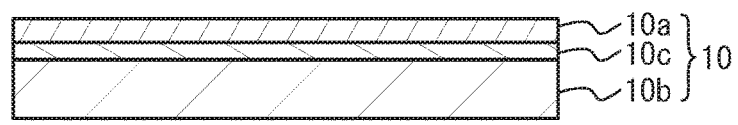
Figure 4D:
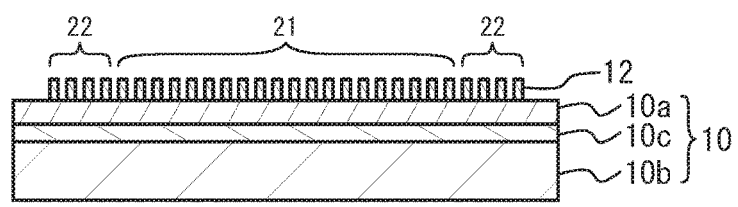

As illustrated in FIG. 4C, the upper surface of the piezoelectric substrate 10 is polished to expose the first region 10a. This process forms the piezoelectric substrate 10 including the first region 10a, the second region 10b, and the third region 10c. As illustrated in FIG. 4D, the metal film 12 is formed on the upper surface of the piezoelectric substrate 10. The IDT 21 and the reflectors 22 are formed of the metal film 12. The metal film 12 is formed by, for example, evaporation and liftoff. The metal layer 12 may be formed by sputtering and etching. Then, the separation into individual chips by dicing or the like is performed.

Second Embodiment

Figure 5:
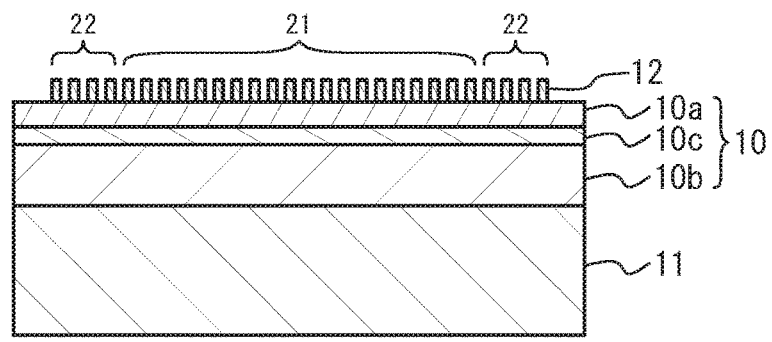
FIG. 5 is a cross-sectional view of an acoustic wave resonator in accordance with a second embodiment.

FIG. 5 is a cross-sectional view of an acoustic wave resonator in accordance with a second embodiment. As illustrated in FIG. 5, the upper surface of a support substrate 11 and the lower surface of the piezoelectric substrate 10 are bonded together. The bonded surface of the piezoelectric substrate 10 and the support substrate 11 is a plane surface and flat. The support substrate 11 is, for example, an insulating substrate such as a sapphire substrate, an alumina substrate, or a spinel substrate, or a semiconductor substrate such as a silicon substrate.

Figure 6:
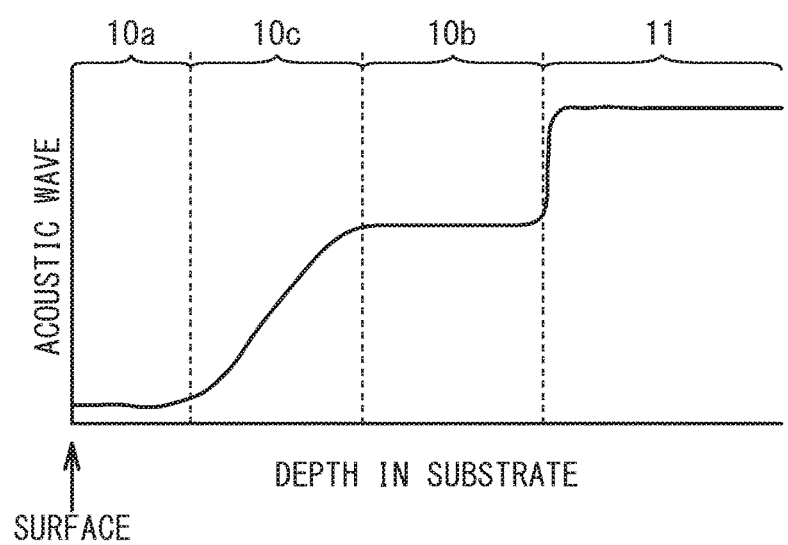
FIG. 6 is a graph of acoustic velocity versus depth in the piezoelectric substrate and a support substrate in the second embodiment.

FIG. 6 is a graph of acoustic velocity versus depth in the piezoelectric substrate and the support substrate in the second embodiment. As illustrated in FIG. 6, the acoustic velocity of the support substrate 11 is greater than that in the second region 10b. Thus, the energy of the bulk wave concentrates in the first region 10a more than that in the first embodiment. Therefore, the insertion loss of the acoustic wave device can be further improved.

As described above, in the second embodiment, the support substrate 11 is bonded under the second region 10b, and has an acoustic velocity greater than that in the second region 10b. This structure can further improve the insertion loss of the acoustic wave device. In addition, by making the linear thermal expansion coefficient of the support substrate 11 less than that of the piezoelectric substrate 10, the frequency temperature dependence of the acoustic wave device can be reduced.

Figure 7A:
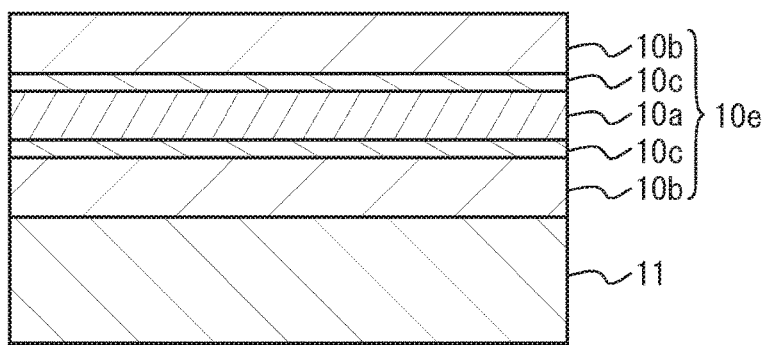
FIG. 7A through FIG. 7C are cross-sectional views illustrating a method of fabricating the acoustic wave resonator in accordance with the second embodiment.
Figure 7B:
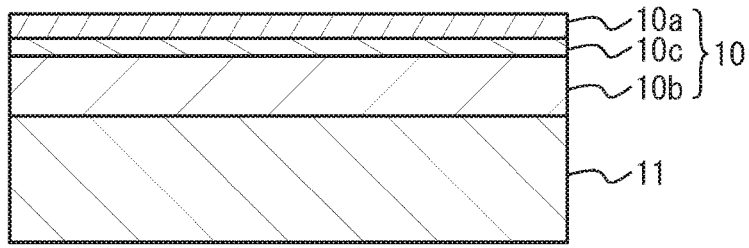
Figure 7C:
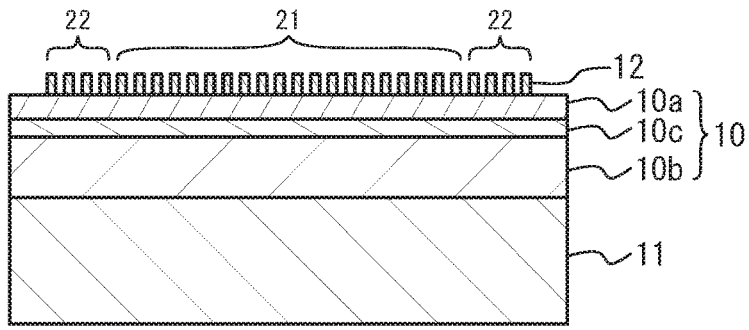

FIG. 7A through FIG. 7C are cross-sectional views illustrating a method of fabricating the acoustic wave resonator in accordance with the second embodiment. As illustrated in FIG. 7A, the piezoelectric substrate 10e in FIG. 4B of the first embodiment is bonded onto the support substrate 11.

The example of the bonding of the piezoelectric substrate 10e and the support substrate 11 will be described. The upper surface of the support substrate 11 and the lower surface of the piezoelectric substrate 10e are irradiated with the ion beam, the neutral beam, or plasma of an inert gas. This process forms an amorphous layer with a thickness of a several nanometers on the upper surface of the support substrate 11 and the lower surface of the piezoelectric substrate 10e. Dangling bonds are formed on the surface of the amorphous layer. The presence of the dangling bonds puts the upper surface of the support substrate 11 and the lower surface of the piezoelectric substrate 10e in an active state. The dangling bond on the upper surface of the support substrate 11 bonds to the dangling bond on the lower surface of the piezoelectric substrate 10e. Thus, the support substrate 11 and the piezoelectric substrate 10e are bonded together at normal temperature. The amorphous layer is integrally formed between the bonded support substrate 11 and the bonded piezoelectric substrate 10e. The amorphous layer has a thickness of, for example, 1 to 8 nm.

As illustrated in FIG. 7B, the upper surface of the piezoelectric substrate 10e is polished so that the first region 10a is exposed. As illustrated in FIG. 7C, as in FIG. 4D, the IDT 21 and the reflectors 22 formed of the metal film 12 are formed. Then, the lower surface of the support substrate 11 may be polished. Thereafter, performed is the separation into individual chips by dicing or the like.

Third Embodiment

Figure 8A:
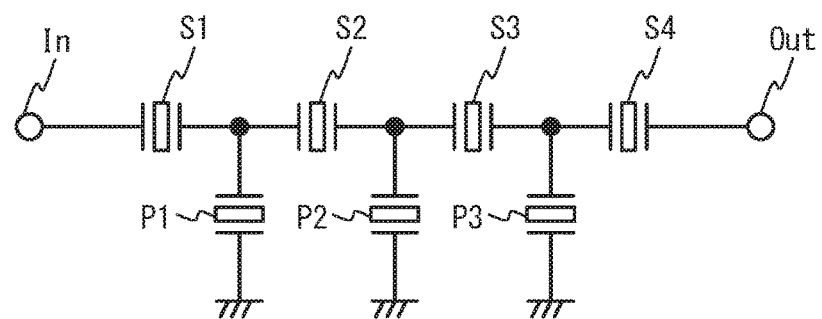
FIG. 8A is a circuit diagram of a ladder-type filter in accordance with a third embodiment.

A third embodiment uses the acoustic wave resonator of any one of the first and second embodiments for a filter or a duplexer. FIG. 8A is a circuit diagram of a ladder-type filter in accordance with the third embodiment. As illustrated in FIG. 8A, series resonators S1 through S4 are connected in series between an input terminal In and an output terminal Out. Parallel resonators P1 through P3 are connected in parallel between the input terminal In and the output terminal Out. At least one of the series resonators S1 through S4 and the parallel resonators P1 through P3 may be the acoustic wave resonator of the first or second embodiment. The number of and the connection of the series resonators and the parallel resonators may be appropriately designed. The acoustic wave resonator of the first or second embodiment may be used for a multimode filter.

Figure 8B:
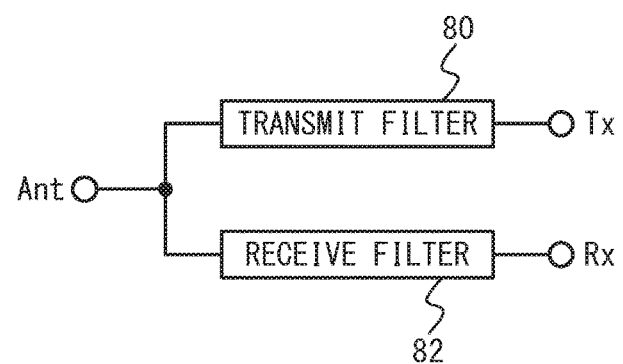
FIG. 8B is a block diagram of a multiplexer in accordance with a variation of the third embodiment.

FIG. 8B is a block diagram of a multiplexer in accordance with a variation of the third embodiment. As illustrated in FIG. 8B, a transmit filter 80 is connected between a common terminal Ant and a transmit terminal Tx. A receive filter 82 is connected between the common terminal Ant and a receive terminal Rx. The transmit filter 80 transmits signals in the transmit band to the common terminal Ant among signals input from the transmit terminal Tx, and suppresses signals in other bands. The receive filter 82 allows signals in the receive band among signals input from the common terminal Ant to pass therethrough, and suppresses signals in other bands. At least one of the transmit filter 80 or the receive filter 82 may be the filter of the third embodiment. A duplexer has been described as a multiplexer, but at least one filter in a triplexer or a quadplexer may be the filter of the third embodiment.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate that is made of a single crystal piezoelectric material, and includes a first region including an upper surface, and a second region that is located under the first region and has a density less than a density of the first region; and
an IDT located on the upper surface of the piezoelectric substrate,
wherein:
the piezoelectric substrate is a lithium tantalate substrate or a lithium niobate substrate, and
the first region has a congruent composition, and the second region has a stoichiometry composition.

2. The acoustic wave device according to claim 1, wherein an acoustic velocity in the second region is greater than an acoustic velocity in the first region.

3. The acoustic wave device according to claim 1, further comprising:
a filter including the IDT.

4. The acoustic wave device according to claim 3, further comprising:
a multiplexer including the filter.

5. The acoustic wave device according to claim 1, further comprising:
a support substrate that is bonded under the second region and has an acoustic velocity greater than an acoustic velocity in the second region.

6. The acoustic wave device according to claim 1, wherein a thickness of the first region is equal to or greater than a pitch of electrode fingers in the IDT.

7. A acoustic wave device, comprising:
a piezoelectric substrate that is made of a single crystal piezoelectric material, and includes a first region including an upper surface, and a second region that is located under the first region and has a density less than a density of the first region; and
an IDT located on the upper surface of the piezoelectric substrate,
wherein:
the piezoelectric substrate includes a third region that is located between the first region and the second region and of which a density changes from the first region to the second region.

8. The acoustic wave device according to claim 7, wherein:
the piezoelectric substrate is a lithium tantalate substrate or a lithium niobate substrate, and
the first region has a congruent composition, and the second region has a stoichiometry composition.

9. The acoustic wave device according to claim 7, wherein an acoustic velocity in the second region is greater than an acoustic velocity in the first region.

10. The acoustic wave device according to claim 7, further comprising:
a support substrate that is bonded under the second region and has an acoustic velocity greater than an acoustic velocity in the second region.

11. The acoustic wave device according to claim 7, wherein
a thickness of the first region is equal to or greater than a pitch of electrode fingers in the IDT.

12. The acoustic wave device according to claim 7, further comprising:
a filter including the IDT.

13. The acoustic wave device according to claim 12, further comprising:
a multiplexer including the filter.

* * * * *